(12) United States Patent
Asakura et al.

(10) Patent No.: US 9,443,704 B2
(45) Date of Patent: Sep. 13, 2016

(54) DATA ANALYSIS METHOD FOR PLASMA PROCESSING APPARATUS, PLASMA PROCESSING METHOD AND PLASMA PROCESSING APPARATUS

(71) Applicant: Hitachi High-Technologies Corporation, Minato-ku, Tokyo (JP)

(72) Inventors: Ryoji Asakura, Tokyo (JP); Kenji Tamaki, Tokyo (JP); Akira Kagoshima, Tokyo (JP); Daisuke Shiraishi, Tokyo (JP)

(73) Assignee: Hitachi High-Technologies Corporation, Tokyo (JP)

( * ) Notice: Subject to any disclaimer, the term of this patent is extended or adjusted under 35 U.S.C. 154(b) by 0 days.

(21) Appl. No.: 15/074,204

(22) Filed: Mar. 18, 2016

(65) Prior Publication Data

US 2016/0203957 A1    Jul. 14, 2016

Related U.S. Application Data

(62) Division of application No. 14/625,855, filed on Feb. 19, 2015, now Pat. No. 9,324,588.

(30) Foreign Application Priority Data

Jul. 17, 2014    (JP) .................................. 2014-146805

(51) Int. Cl.
*C23F 1/00* (2006.01)
*H01L 21/306* (2006.01)
*H01J 37/32* (2006.01)

(52) U.S. Cl.
CPC .... *H01J 37/32926* (2013.01); *H01J 37/32009* (2013.01); *H01J 37/32972* (2013.01); *H01J 2237/334* (2013.01)

(58) Field of Classification Search
CPC ................... H01J 37/32926; H01J 37/32009; G01J 3/443
USPC ..................................................... 156/345.24
See application file for complete search history.

(56) References Cited

U.S. PATENT DOCUMENTS

| | | | |
|---|---|---|---|
| 7,158,848 B2 | 1/2007 | Tanaka et al. | |
| 2012/0085494 A1* | 4/2012 | Uchida | H01J 37/32963 156/345.25 |
| 2015/0083328 A1 | 3/2015 | Asakura | |

FOREIGN PATENT DOCUMENTS

JP    4547396 B2    7/2010

* cited by examiner

*Primary Examiner* — Roberts Culbert
(74) *Attorney, Agent, or Firm* — Miles & Stockbridge P.C.

(57) ABSTRACT

A stable etching process is realized at an earlier stage by specifying the combination of wavelength and time interval, which exhibits a minimum prediction error of etching processing result within a short period. For this, the combination of wavelength and time interval is generated from wavelength band of plasma emission generated upon etching of the specimen, the prediction error upon prediction of etching process result is calculated with respect to each combination of wavelength and time interval, the wavelength combination is specified based on the calculated prediction error, the prediction error is further calculated by changing the time interval with respect to the specified wavelength combination, and the combination of wavelength and time interval, which exhibits the minimum value of calculated prediction error is selected as the wavelength and the time interval used for predicting the etching processing process.

3 Claims, 12 Drawing Sheets

F I G. 1
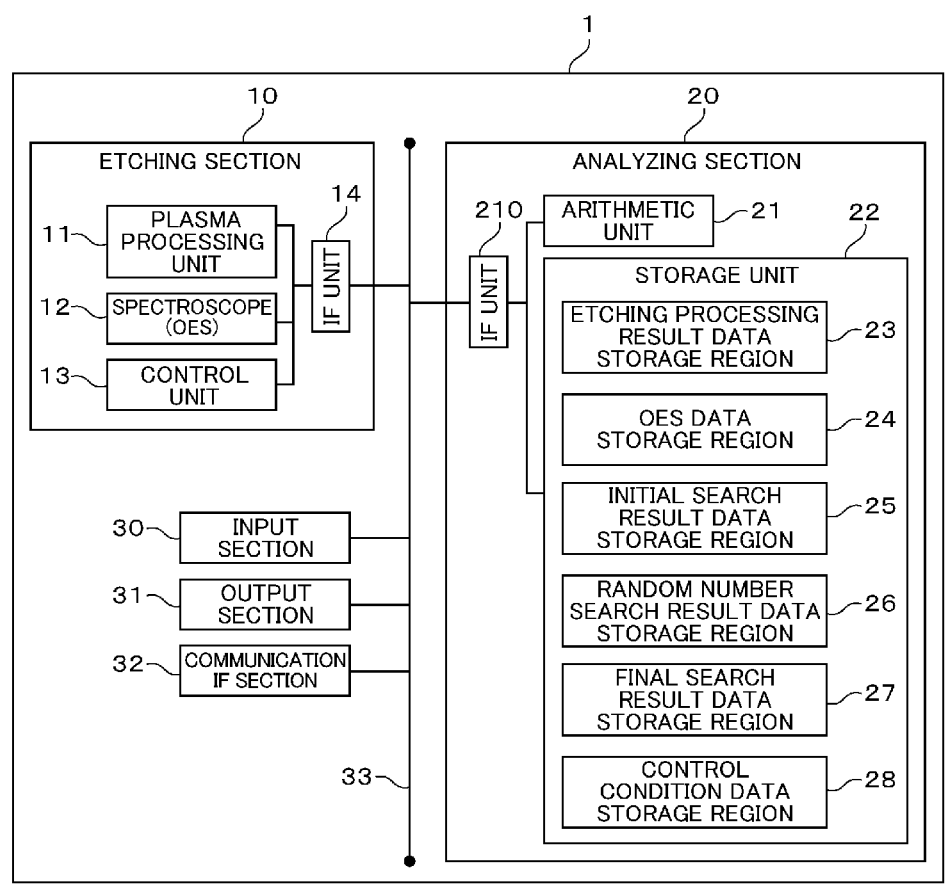

| 23b | WAVER ID | p1 | p2 | ... | p100 |
|---|---|---|---|---|---|
| 23c | ETCHING PROCESSING RESULT | 0.75 | 0.80 | ... | 0.71 |

| WAVER ID | p1 | | | |
|---|---|---|---|---|
| | WAVELENGTH | | | |
| | 201 | 202 | ... | 800 |
| TIME | 1 | 103 | 103 | ... | 77 |
| | 2 | 107 | 108 | ... | 82 |
| | ... | ... | ... | ... | ... |
| | 100 | 140 | 142 | ... | 96 |

FIG. 7

| ID | WAVELENGTH 1 | WAVELENGTH 2 | WAVELENGTH 1-TIME INTERVAL | WAVELENGTH 2-TIME INTERVAL | PREDICTION ERROR | PREDICTION ERROR RANK | CONTINUOUS SEARCH | TANDARD DEVIATION OF EMISSION INTENSITY | PREDICTION ERROR RANK 1 (GROUP OF SMALL STANDARD DEVIATION) | PREDICTION ERROR RANK 2 (GROUP OF LARGE STANDARD DEVIATION) |
|---|---|---|---|---|---|---|---|---|---|---|
| 1 | 251 | 288 | 1-50 | 1-100 | 0.124 | 465 | - | 21 | 129 | - |
| 2 | 451 | 656 | 1-50 | 1-100 | 0.089 | 116 | - | 32 | 72 | - |
| ... | ... | ... | ... | ... | ... | ... | ... | ... | ... | ... |
| 1000 | 251 | 772 | 51-100 | 1-100 | 0.021 | 2 | ○ | 129 | - | 2 |
| ... | ... | ... | ... | ... | ... | ... | ... | ... | ... | ... |
| 1200 | 288 | 772 | 51-100 | 1-100 | 0.019 | 1 | ○ | 108 | - | 1 |
| ... | ... | ... | ... | ... | ... | ... | ... | ... | ... | ... |

F I G. 8

| ID (26b) | WAVELENGTH 1 (26c) | WAVELENGTH 2 (26d) | WAVELENGTH 1-TIME INTERVAL (26e) | WAVELENGTH 2-TIME INTERVAL (26f) | PREDICTION ERROR (26g) | PREDICTION ERROR RANK (26h) | CONTINUOUS SEARCH (26i) |
|---|---|---|---|---|---|---|---|
| 1000 | 251 | 772 | 63-87 | 12-90 | 0.015 | 1 | ○ |
| 1200 | 288 | 772 | 72-90 | 22-89 | 0.018 | 4 | − |
| ... | ... | ... | ... | ... | ... | ... | ... |

26a

F I G. 9

| ID (27b) | WAVELENGTH 1 (27c) | WAVELENGTH 2 (27d) | WAVELENGTH 1-TIME INTERVAL (27e) | WAVELENGTH 2-TIME INTERVAL (27f) | PREDICTION ERROR (27g) |
|---|---|---|---|---|---|
| 1000 | 251 | 772 | 66-87 | 11-87 | 0.014 |

27a

F I G. 1 0 A
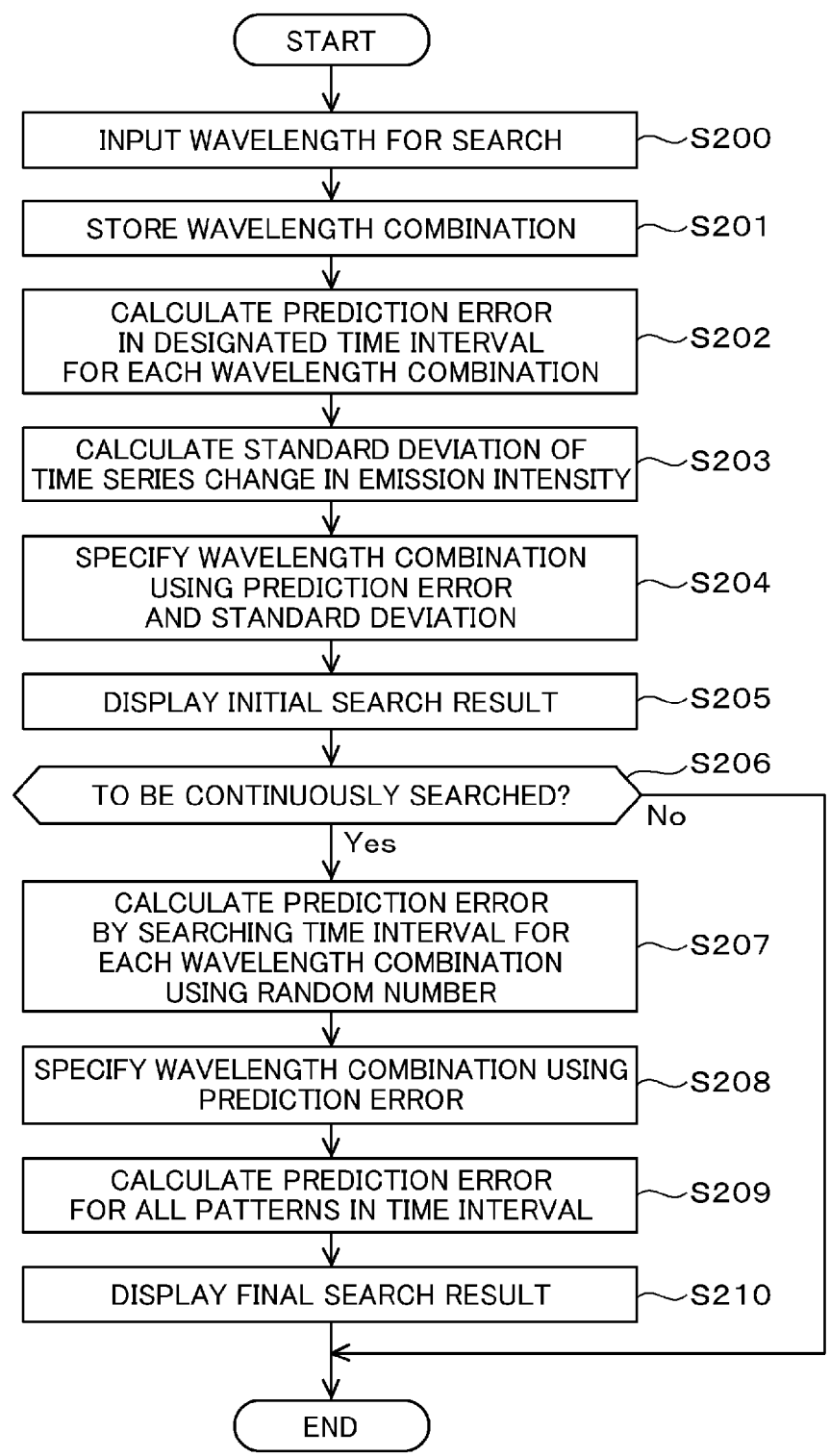

DATA ANALYSIS METHOD FOR PLASMA PROCESSING APPARATUS, PLASMA PROCESSING METHOD AND PLASMA PROCESSING APPARATUS

BACKGROUND

The present invention relates to a method of analyzing data of a plasma processing apparatus for processing a semiconductor wafer through plasma, a plasma processing method, and a device used for the plasma processing method.

In order to obtain the micro shape of the semiconductor device to be formed on the wafer, plasma processing such as an etching process is performed for bringing a substance into an ionized state (plasma state) so as to remove the substance on the wafer through its action (reaction on the wafer surface).

The plasma processing apparatus such as the etching apparatus for processing with plasma is equipped with a spectroscope (OES: Optical Emission Spectroscopy) which allows monitoring of the plasma light in order to cope with light emission resulting from ionizing phenomenon caused by the plasma. The data measured by the spectroscope will be referred to as OES data.

In order to stabilize the micro shape of the semiconductor device, the etching apparatus is structured to apply control technology to measure the OES data, predict etching processing results such as dimension of the micro shape, and adjust the etching processing condition.

It is necessary to predict the etching processing results with minimum error by using the OES data for stabilization of the etching processing result.

There is a known method of predicting the etching processing result as disclosed in JP-4547396.

JP-4547396 discloses the method of predicting the etching processing result by selecting monitor data and the corresponding time interval which are used for predicting the etching processing result from monitor data of the apparatus, including the OES data, and predicting the etching processing result using values only of the selected monitor data and the time interval, and the method of adjusting the etching processing condition in accordance with the prediction result.

SUMMARY

JP-4547396 merely discloses the method of specifying the time interval with small prediction error of the etching processing result. The value of the OES data varies depending on the wavelength of emitted light, and changes over time during etching process. The prediction error may become large depending on combination of the selected wavelength and time interval. In order to stabilize the etching processing result, it is necessary to specify the combination of the wavelength and the time interval, which exhibits the small prediction error of the etching processing result. Because of a huge number of combinations of wavelength and time interval, it is further necessary to specify the combination with small prediction error from those combinations within a short period in view of practical application for daily work.

An object of the invention is to provide a data analysis method of an etching apparatus, capable of executing the etching process stabilized at an earlier stage by specifying both wavelength and time interval, which exhibit small prediction error of the etching processing result within a short period, an etching method using the analysis result, and the device used for the method.

The present invention provides a data analyzing method including the steps of generating a combination of wavelength and time interval from wavelength band of plasma emission generated by etching a specimen, calculating a prediction error upon prediction of an etching processing result with respect to the generated combinations of wavelength and time interval, specifying the wavelength combination based on the calculated prediction error to further calculate the prediction error by changing the time interval with respect to the specified wavelength combination, and selecting the wavelength combination, which exhibits a minimum value of the calculated prediction error, as the wavelength and the time interval used for predicting the etching processing result.

The present invention provides the etching method including the steps of etching a specimen inside an exhausted vacuum processing chamber by introducing etching gas into the chamber to generate plasma while monitoring emission of the generated plasma under a predetermined etching processing condition, generating a wavelength combination from wavelength band of plasma emission generated by etching the specimen, calculating a prediction error upon prediction of an etching processing result with respect to the respectively generated wavelength combination, specifying the wavelength combination based on the calculated prediction error, further calculating the prediction error by changing the time interval with respect to the specified wavelength combination, selecting the combination of wavelength and time interval, which exhibits a minimum value of the calculated prediction error, as the wavelength and the time interval used for predicting the etching processing result, and adjusting the etching processing condition using a prediction value of the etching processing result with respect to the selected wavelength and time interval.

The present invention provides an etching apparatus which includes a processing chamber, a plasma generating unit for generating plasma by introducing etching gas into the processing chamber exhausted in vacuum, in which a specimen is disposed, an emission monitor unit for monitoring emission of the plasma generated by the plasma generating unit, an arithmetic unit for generating data concerning a condition of controlling the plasma generating unit, a storage unit for storing the data concerning condition of controlling the plasma generating unit, which has been generated by the arithmetic unit, and a control unit for controlling the plasma generating unit based on a state of the plasma emission monitored by the plasma emission monitor unit and the control data stored in the storage unit. The arithmetic unit generates a wavelength combination from wavelength band of the plasma emission to be generated by etching the specimen as a condition for etching the specimen by the plasma generating unit, calculates a prediction error for prediction of the etching processing result with respect to the combinations of wavelength and time interval, specifies a wavelength combination based on the calculated prediction error, further calculates the prediction error by changing the time interval with respect to the specified wavelength combination, and selects the combination of wavelength and time interval, which exhibits a minimum value of the further calculated prediction error, as the wavelength and the time interval used for prediction of the etching processing result so as to generate the condition for etching the set specimen.

The present invention ensures to specify the combination of wavelength and time interval, which only exhibits small prediction error of the etching processing result from the OES data, and to stabilize the etching processing result.

These features and advantages of the invention will be apparent from the following more particular description of preferred embodiments of the invention, as illustrated in the accompanying drawings.

BRIEF DESCRIPTION OF THE DRAWINGS

FIG. 1 is a block diagram schematically representing a structure of an etching apparatus according to an embodiment of the invention;

FIG. 6 is a table representing an example of OES data according to an embodiment of the invention;

FIG. 7 is a table representing an example of initial search result data according to an embodiment of the invention;

FIG. 8 is a table representing an example of random number search result data according to an embodiment of the invention;

FIG. 9 is a table representing an example of final search result data according to an embodiment of the invention;

FIG. 10A is a flowchart representing an analyzing process flow performed by an arithmetic unit according to an embodiment of the invention;

DESCRIPTION OF THE PREFERRED EMBODIMENTS

Figure 2:
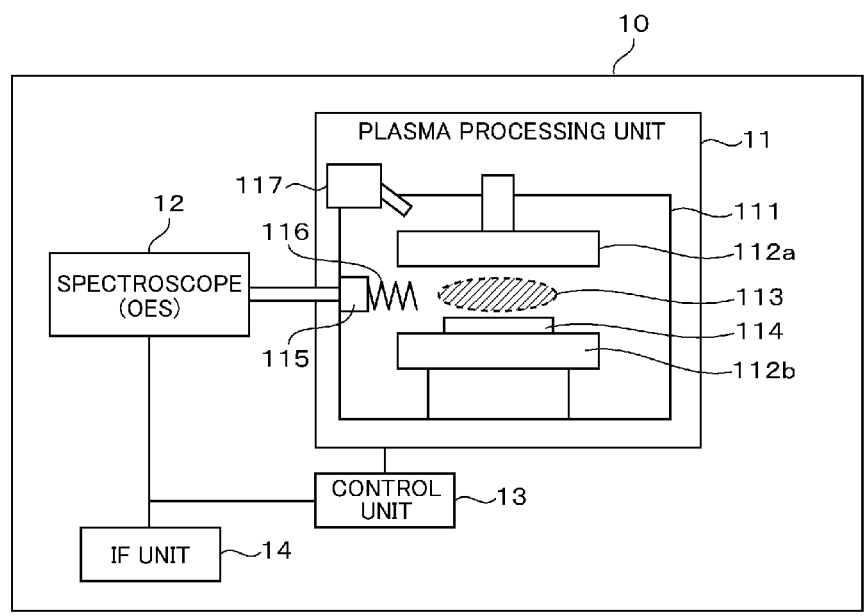
FIG. 2 is a block diagram schematically representing a structure of an etching section of the etching apparatus according to the present embodiment of the invention.

The method of analyzing data of the etching apparatus according to the invention allows acquisition of plasma emission data indicating the emission intensity with respect to a plurality of values of wavelength and time, which are obtained upon the etching process and the etching processing result, and evaluation of a prediction error of the etching processing result based on the average value of the emission intensity with respect to different combinations of wavelength and the time interval of the plasma emission data. This enables to specify the combination of wavelength and time interval of the plasma emission data used for prediction of the etching processing result based on the prediction error. This process is applied to the etching method and the etching apparatus. An embodiment of the invention will be described referring to the drawings. For all the drawings referred to explain the present embodiment, the same elements are designated with the same codes, and repetitive explanations thereof, thus, will be omitted.

Etching Apparatus

As the structure of an etching apparatus according to the invention of FIG. 1 indicates, an etching apparatus 1 includes an etching section 10, an analyzing section 20, an input section 30, an output section 31, and a communication interface section (communication IF section) 32, which are mutually connected with one another via a bus 33.

The etching section 10 includes a plasma processing unit 11, a spectroscope (OES) 12, a control unit 13, and an interface unit (IF unit) 14. The plasma processing unit 11 generates plasma to process the wafer. The spectroscope (OES) 12 acquires the OES data as the plasma emission data during the etching process. The OES data are stored in a storage unit 22 of the analyzing section 20 via the IF unit 14. The control unit 13 controls processing performed by the plasma processing unit 11. The etching section 10 will be described later in detail referring to FIG. 2.

The analyzing section 20 executes the process of specifying the combination of wavelength and time interval, which is used for prediction of the etching processing result. The analyzing section 20 includes an arithmetic unit 21 for data analysis, the storage unit 22, and an interface unit (IF unit) 210.

The storage unit 22 includes an etching processing result data storage region 23 for storing the etching processing result for each wafer, an OES data storage region 24 for storing measurement values of the spectroscope (OES) which are acquired during the etching process, an initial search result data storage region 25 for storing initial search result data of the search process performed by the arithmetic unit 21, a random number search result data storage region 26 for storing data of a random search result performed by the arithmetic unit 21, a final search result data storage region 27 for storing final search result data, and a control condition data storage region 28 for storing conditions to be controlled by the plasma processing unit 11 for etching process of the wafer.

The arithmetic unit 21 sequentially evaluates the prediction error for prediction of the etching result in accordance with the emission intensity for each combination of wavelength and time interval in the etching processing result data storage region 23 of the storage unit 22, and the OES data stored in the OES data storage region 24. Then the arithmetic unit further specifies the combination of wavelength and time interval, which is used for prediction of the etching processing result. The analyzing process performed by the arithmetic unit 21 will be described later in detail.

The input section 30 is formed as a mouse, a keyboard and the like for receiving information input through operation of the user. The output section 31 is formed as a display, a printer and the like for outputting the information to the user. The communication IF section 32 is formed as an interface connected to another device (connectable to the inspection device for measuring etching processing results) and the system (connectable to the existing production management system) via the bus 33, an external network and the like for receiving and transmitting the information. The bus 33 serves to link the respective sections (10, 20, 30, 31, 32). Each of the IF units (14, 210) in the respective sections is the interface for receiving and transmitting the information via the bus 33. The analyzing section 20 may be formed as an independent analyzing device which is connected to the etching apparatus including the etching section 10 via the IF unit 210.

Etching Section

The etching section 10 includes the plasma processing unit 11, the spectroscope (OES) 12, the control unit 13, and the IF unit 14. The plasma processing unit 11 includes a chamber 111 that is vacuumed by a not-shown vacuum exhaust unit, a pair of electrodes 112a, 112b which generate plasma inside the vacuum exhausted chamber 111 in response to application of radio frequency power from a not-shown power source, a window 115 which allows observation of the inside of the chamber 111 from outside, and a gas supplier 117 in the vacuum exhausted chamber 111 for supplying etching gas so as to subject the wafer 114 to the etching process.

In the aforementioned structure, the plasma processing unit 11, according to an instruction from the control unit 13, generates plasma from the etching gas supplied from the gas supplier 117 through the not-shown power source between the electrodes 112a and 112b to which the radio frequency power is applied in the state where the chamber 111 that stores the wafer 114 is vacuum exhausted by the not-shown exhaust unit. The plasma gas 113 is impinged on the wafer 114 so as to be processed.

The thus generated plasma gas 113 includes an element contained in the etching gas supplied by the gas supplier 117 and an element generated from the wafer 114 in processing, and emits a light ray 116 with wavelength in accordance with the element contained in the plasma gas 113. The emitted light 116 is measured by the spectroscope (OES) 12 through the window 115, and stored in the OES data storage region 24 of the storage unit 22 in the analyzing section 20 via the IF unit 14.

The control unit 13 serves to adjust an etching processing condition by inputting the OES data measured by the spectroscope (OES) 12 as the process of adjusting the etching processing condition to be described later in addition to an instruction given to the plasma processing unit 11.

At the end of the etching process, the processed wafer 114 is taken from the chamber 111, and carried to another device (measurement device, for example) so that another new wafer 114 is stored in the etching section 10 for the etching process. The processed wafer 114 is subjected to measurement of a dimension of the pattern shape obtained as a result of the etching process performed by another device (measurement device). The dimension of the shape may be stored in the etching processing result data storage region 23 of the storage unit 22 as the etching processing result data.

OES Data

Figure 3:
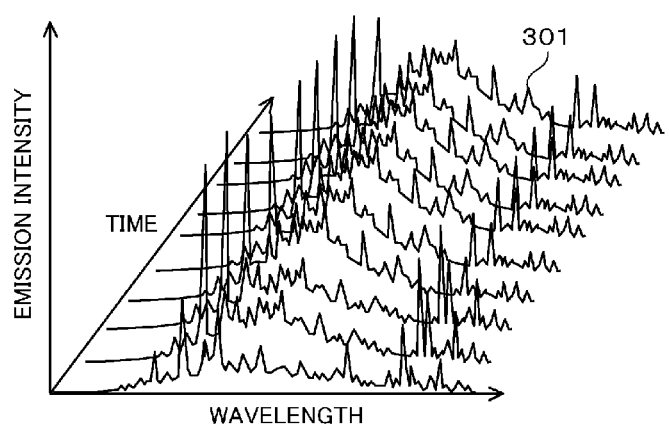
FIG. 3 is a graph representing an example of the OES data.

FIG. 3 shows a waveform signal 301 as an example of the OES data of plasma emission measured by the spectroscope (OES) 12. The wavelength band and intensity of the plasma emission will vary as passage of time during the etching process. The waveform signal 301 of the OES data includes two dimensional elements of wavelength and time, indicating the value of the emission intensity measured with respect to each waveform and each time. The value of the emission intensity measured for each waveform and each time will be stored in the OES data storage region 24 to be described later together with the wafer ID having the OES data measured.

Etching Processing Condition Adjustment Process

Figures 4, 5:
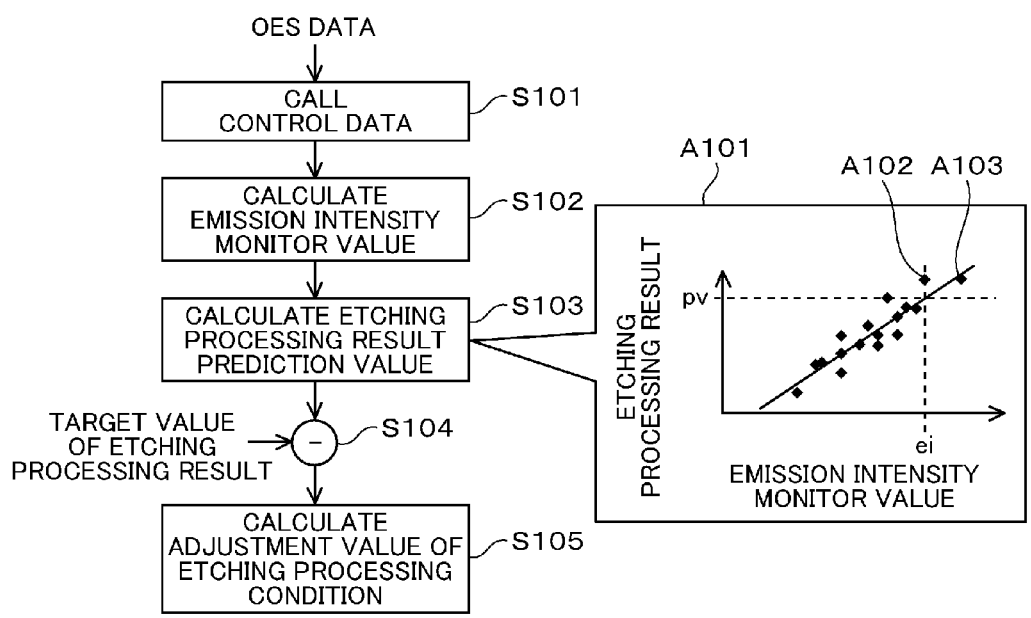
FIG. 4 shows a flowchart explaining an example of the control for adjusting the etching processing condition and a scatter chart representing a relationship between the emission intensity monitor values and the etching processing result.
FIG. 5 is a table representing an example of etching processing result data according to an embodiment of the invention.

FIG. 4 shows an example of the etching processing condition adjustment process performed by the control unit 13. The control unit 13 calls control data stored in the control condition data storage region 28 of the storage unit 22 in response to an instruction of an operator to adjust the etching processing condition (S101). The etching processing condition adjustment process is sequentially performed for a plurality of wafers using the control data stored in the control condition data storage region 28. The first wafer is processed under the preliminarily set condition.

The average value of the emission intensity of a predetermined combination of wavelength and time interval is calculated, or the average value of emission intensity of a predetermined combination of wavelength and time interval is divided by the average value of emission intensity of another predetermined combination of wavelength and time interval (S102). The value derived from dividing the average value of the emission intensity of the predetermined combination of wavelength and time interval by the average value of emission intensity of another predetermined combination of wavelength and time interval will be hereinafter referred to as an emission intensity monitor value. The average value of emission intensity of the predetermined combination of wavelength and time interval may be set to the emission intensity monitor value.

The control unit 13 predicts the etching processing result upon input of the aforementioned emission intensity monitor value (S103). A graph A101 shows an example of the process of predicting the etching processing result executed in S103. A y-axis and an x-axis of the graph A101 represent the etching processing result and the emission intensity monitor value, respectively. Each point A102 on the graph represents each sheet of the wafer. The graph shows the correlation between the emission intensity monitor value and the etching processing result. A straight line A103 is a regression line indicating the relationship between the emission intensity monitor value derived from a plurality of points A102 and the etching processing result. The straight line A103 is drawn so that the sum of squares of the distance from each point of a plurality of points A102 is minimized. In S103, the regression line A103 is used to calculate a prediction value (pv) of the etching processing result from the emission intensity (ei) as a dotted line shown in the drawing.

The control unit 13 calculates the difference between a target value and a prediction value (pv) of the etching processing result (S104). Based on the difference, the control unit calculates an adjustment value of the etching processing condition, for example, the flow rate of the etching gas (gas flow rate) supplied from the gas supplier 117, and time taken for executing the etching process (S105).

The control unit 13 executes the etching process under the adjusted etching processing condition after completion of the process of adjusting etching processing condition.

Analyzing Section

The information that specifies ID of the wafer subjected to the etching process, and the information that specifies the etching processing result will be stored in the etching processing result data storage region 23 of the storage unit 22 shown in FIG. 1.

FIG. 5 shows an etching processing result data table 23a as an example of the etching processing result data storage region 23. This table includes fields of columns 23b for wafer ID and 23c for etching processing result.

The information that specifies the wafer 114 is stored in the column 23b for wafer ID. The value to be stored in the column 23b for wafer ID is corresponded to the value stored in a column 25b for wafer ID of an OES data table 25a which will be described later so that the OES data derived from etching the respective wafers are corresponded to the etching processing results.

The information that specifies the etching processing result is stored in the column 23c for etching processing result. For example, the measurement result of the surface shape of the wafer 114 specified in the column 23b for wafer ID (for example, dimension of the pattern formed on the wafer 114 measured with a length measuring SEM, and dimension between patterns) which is measured after the etching process by using the measurement device which is connected to the etching apparatus 1. The dimension information of the surface shape for each wafer is stored in the etching processing result data storage region 23 via the communication IF section 32.

FIG. 6 shows an OES data table 24a as an example of the OES data storage region 24. This table includes fields of columns 24b for wafer ID, 24c for wavelength, 24d for time, and 24e for emission intensity. The number of the tables corresponds to the number of wafers subjected to the OES data measurement.

The column 24b for wafer ID stores the information that specifies the wafer 114. The value stored in the column 24b for wafer ID corresponds to the value to be stored in the column 23b for wafer ID of the etching processing result data table 23a as described above.

The column 24e for emission intensity stores the value of emission intensity measured for each wavelength in the column 24c for wavelength, and each time in the column 24d for time, respectively.

FIG. 7 shows an initial search result data table 25a as an example of the initial search result data storage region 25. This table includes various fields of columns 25b for ID, 25c for wavelength 1, 25d for wavelength 2, 25e for wavelength 1-time interval, 25f for wavelength 2-time interval, 25g for prediction error, 25h for prediction error rank, 25i for continuous search, 25j for standard deviation of emission intensity, 25k for prediction error rank 1, and 25l for prediction error rank 2.

Each field stores the information obtained through the analyzing process to be described later.

The column 25b for ID stores the information that specifies the wavelength combination. The column 25c for wavelength 1 stores the information that specifies a candidate of the wavelength used for prediction of the etching processing result. The value stored in a line i of the column 25c for wavelength 1 will be referred to as WL1 for explanation to be described later.

The column 25d for wavelength 2 stores the information that specifies a candidate of the wavelength used for prediction of the etching processing result. The value stored in a line i of the column 25d for wavelength 2 will be referred to as WL2 for explanation to be described later.

The column 25e for wavelength 1-time interval stores the information that specifies a candidate of the time interval used for prediction of the etching processing result. The value stored in a line i of the column 25e for wavelength 1-time interval will be referred to as WLT1 for explanation to be described later.

The column 25f for wavelength 2-time interval stores the information that specifies a candidate of the time interval to be used for prediction of the etching processing result. The value stored in a line i of the column 25f for wavelength 2-time interval will be referred to as WLT2 for explanation to be described later.

Values stored in the columns 25c for wavelength 1, 25d for wavelength 2, 25e for wavelength 1-time interval, and 25f for wavelength 2-time interval are used to predict the etching processing result in accordance with the emission intensity monitor value derived from dividing the average value of the emission intensity in the time interval WLT1 stored in the column 24d for time with respect to the wavelength WL1 stored in the column 24c for wavelength of the OES data table 24a in the OES data storage region 24 as shown in FIG. 6 by the average value of the emission intensity in the time interval WLT2 stored in the column 24d for time with respect to the wavelength WL2 stored in the column 24c for wavelength.

The column 25g for prediction error stores the information that specifies the prediction error for predicting the etching processing result using the calculated emission intensity monitor value in accordance with values stored in the columns 25c for wavelength 1, 25d for wavelength 2, 25e for wavelength 1-time interval, and 25f for wavelength 2-time interval.

The column 25h for prediction error rank stores the value that indicates the rank among information data stored in the respective lines of the column 25g for prediction error. The column 25i for continuous search stores the information that specifies the wavelength combination for continuous search in the time interval. The column 25j for standard deviation of emission intensity stores the information that specifies the standard deviation of the time series change in the emission intensity.

The column 25k for prediction error rank 1 stores the value indicating the rank of information data stored in the respective lines of the column 25g for prediction error. Such value is calculated with respect to the group (group of small standard deviation value) in the line, having the value stored in the column 25j for standard deviation of emission intensity smaller than a predetermined threshold value.

The column 25l for prediction error rank 2 stores the value indicating the rank of information data stored in the respective lines of the column 25g for prediction error. Such value is calculated with respect to the group (group of large standard deviation value) in the line, having the value stored in the column 25j for standard deviation of emission intensity equal to or larger than the predetermined threshold value.

FIG. 8 shows a random number search result data table 26a as an example of the random number search result data storage region 26. This table includes fields of columns 26b for ID, 26c for wavelength 1, 26d for wavelength 2, 26e for wavelength 1-time interval, 26f for wavelength 2-time interval, 26g for prediction error, 26h for prediction error rank, and 26i for continuous search.

Each field stores the information obtained through the analyzing process to be described later.

The column 26b for ID stores the information that specifies the wavelength combination common with the one stored in the column 25b for ID of the initial search result data table 25a shown in FIG. 7. The column 26c for wavelength 1 stores the information that specifies a candidate of the wavelength used for prediction of the etching processing result. The column 26d for wavelength 2 stores the information that specifies a candidate of the wavelength used for prediction of the etching processing result.

The column 26e for wavelength 1-time interval stores the information that specifies a candidate of the time interval used for prediction of the etching processing result.

The column 26f for wavelength 2-time interval stores the information that specifies a candidate of the time interval used for prediction of the etching processing result.

Like the initial search result data storage region 25 as described above, values stored in the columns 26c for wavelength 1, 26d for wavelength 2, 26e for wavelength 1-time interval, and 26f for wavelength 2-time interval represent each wavelength of emission and time interval for predicting the etching processing result.

The column 26g for prediction error stores the information that specifies the prediction error for predicting the etching processing result using the emission intensity monitor value calculated with values stored in the columns 26c for wavelength 1, 26d for wavelength 2, 26e for wavelength 1-time interval, and 26f for wavelength 2-time interval.

The column 26h for prediction error rank stores the value representing the rank of information data stored in the respective lines of the column 26g for prediction error.

The column 26i for continuous search stores the information that specifies the wavelength combination for continuous search in the time interval.

FIG. 9 shows a final search result data table 27a as an example of the final search result data storage region 27. This table includes fields of columns 27b for ID, 27c for wavelength 1, 27d for wavelength 2, 27e for wavelength 1-time interval, 27f for wavelength 2-time interval, and 27g for prediction error.

Each field stores the information obtained through the analyzing process to be described later.

The column 27b for ID stores the information that specifies the wavelength combination common with the one stored in the column 25b for ID of the initial search result data table 25a shown in FIG. 7. The column 27c for wavelength 1 stores the information that specifies a candidate of the wavelength used for prediction of the etching processing result. The column 27d for wavelength 2 stores the information that specifies a candidate of the wavelength used for prediction of the etching processing result.

The column 27e for wavelength 1-time interval stores the information that specifies a candidate of the time interval used for prediction of the etching processing result.

The column 27f for wavelength 2-time interval stores the information that specifies a candidate of the time interval used for prediction of the etching processing result.

Like the explanation with respect to the initial search result data storage region 25, values stored in the columns 27c for wavelength 1, 27d for wavelength 2, 27e for wavelength 1-time interval, and 27f for wavelength 2-time interval represent the wavelength of emission and time interval of emission for predicting the etching processing result.

The column 27g for prediction error stores the information that specifies the prediction error for predicting the etching processing result using the emission intensity monitor value calculated with values stored in the columns 27c for wavelength 1, 27d for wavelength 2, 27e for wavelength 1-time interval, and 27f for wavelength 2-time interval.

Analyzing Process in Analyzing Section 20

The analyzing process according to the present embodiment is the method of specifying the wavelength of plasma emission data and time which are used for prediction of the etching processing result in the semiconductor etching process which etches the semiconductor wafer with plasma.

The method of analyzing process according to the present embodiment includes six steps. In the first step, calculating a prediction error upon prediction of the etching processing result using the emission intensity average value in a first half of the time interval in the etching process as well as a prediction error used for the prediction of the etching processing result using the emission intensity average value in a second half of the time interval in the etching process for each candidate of the wavelength used for prediction. In the second step, specifying a plurality of wavelength values each with small calculated prediction error. In the third step, calculating the prediction error in predicting an etching result by using an emission intensity average value in the respectively set time intervals which are set by using the random number for each of the specified plurality of wavelength values and. In the fourth step, specifying the wavelength value with small prediction error calculated in the second evaluation step. In the fifth step, calculating the prediction error in predicting an etching processing result by using emission intensity average values for each of all possible time intervals with respect to the specified wavelength. And in the sixth step, specifying a combination of wavelength and time interval, which is used for prediction of the etching processing result, by specifying the time interval with the minimum prediction error from all possible time intervals with respect to the specified wavelength.

The specific method of analyzing process according to the present embodiment will be described.

In a stage before sequentially etching a plurality of wafers using the etching apparatus 1 in the production process, an operator or a manager of the etching apparatus 1 executes the analyzing process through the analyzing section 20 for determining the combination of wavelength and time interval for prediction of the etching processing result.

Since the combination of wavelength and time interval suitable for prediction of the etching processing result varies depending on the film structure on the surface of the semiconductor wafer to be subjected by the etching process, it is necessary to execute the analyzing process as needed upon start of the etching process. Using the etching processing condition determined by the aforementioned analyzing process, a plurality of wafer are sequentially subjected to the etching process through the etching apparatus 1 in the production process (mass-production process).

Figure 12:
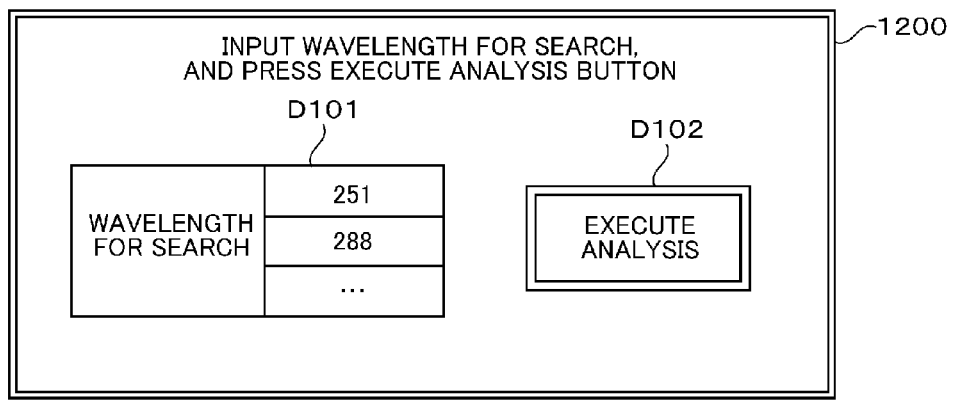
FIG. 12 is a front view of a screen displaying a section for input of wavelength for search and an analysis execution button according to an embodiment of the invention.

In execution of the analyzing process through the analyzing section 20, the condition for executing the analyzing process is input on a display screen 1200 as shown in FIG. 12. The operator inputs the wavelength for search in the column D101 for input of wavelength for search on the display screen 1200, and clicks an analyzing execute button D102 to instruct execution of analysis. The analyzing section 20 then performs the analyzing process to output the combination of wavelength and time interval, which is suitable for prediction of the etching processing result.

The column D101 for input of the wavelength for search on the display screen 1200 stores the information that specifies the wavelength for evaluating the prediction error. The predetermined wavelength (wavelength determined at an equal interval, for example, 201, 211) may be automatically input in the column D101 for input of the wavelength for search. The wavelength indicating emission of an element contained in the plasma gas 113 may also be automatically input. The wavelength having the emission intensity higher than that of the peripheral wavelength, that is, the wavelength indicating the plasma emission peak may also be input in the column. The analyzing process flow performed by the analyzing section 20 will be described referring to FIGS. 10A to 10D.

The wavelength for search is input in the column D101 for input of wavelength for search on the display screen 1200 shown in FIG. 12 (S200). Then the combination of wavelength for search which has been input in S200 is generated, and stored in the initial search result data table 25*a* shown in FIG. 7 (S201). The prediction error in the designated time interval with respect to the combination of wavelength for search generated in S201 is calculated (S202). The standard deviation of time series change in the plasma emission intensity is calculated (S203). The wavelength combination is specified using the prediction error calculated in S202 and the standard deviation calculated in S203 (S204). The initial search result is displayed on the screen (S205).

It is determined whether or not the search is to be continued (S206). If the search is not continued (No in S206), the process ends. Meanwhile, if the search is continued (Yes in S206), the time interval is searched for each wavelength combination using the random number to calculate the prediction error (S207). The wavelength combination is specified using the thus calculated prediction error (S208). The prediction error for all the patterns in the time interval is calculated with respect to the specified wavelength combination (S209). The final search result is displayed (S210), and the process ends.

The respective process steps will be described in detail.

In S201, the arithmetic unit 21 generates a plurality of combinations of two wavelengths using a plurality of wavelengths for search which have been input in the column D101 for input of wavelength for search on the display screen 1200 in S200 as shown in FIG. 12 so that each wavelength of the combinations is stored in the columns 25*c* for wavelength 1 and 25*d* for wavelength 2 of the initial search result data table 25*a*, respectively as shown in FIG. 7. The combination to be stored may be those of all the wavelengths input in the column D101 for input of wavelength as shown in FIG. 12. The arithmetic unit 21 sequentially performs numbering from the first line sequentially in the column 25*b* for ID as shown in FIG. 7.

In S202, the arithmetic unit 21 outputs the prediction error of the etching processing result derived from calculating the emission intensity monitor value in the designated time interval with respect to the wavelength combinations stored in the respective lines of the initial search result data table 25*a* shown in FIG. 7. The arithmetic unit 21 sequentially executes the process of the information from the upper line of the initial search result data table 25*a*.

Figure 10B:
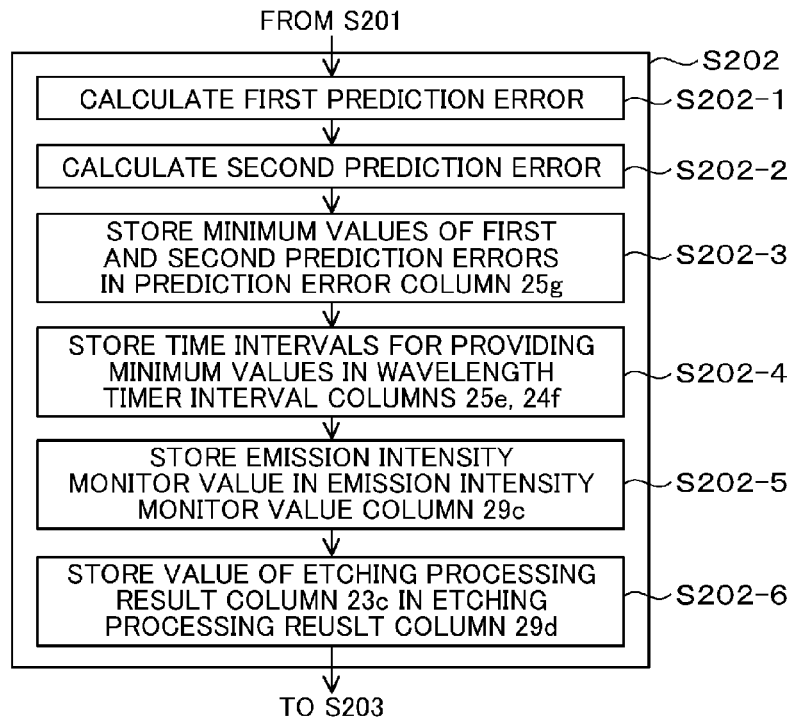
FIG. 10B is a flowchart representing the analyzing process flow performed by the arithmetic unit according to the present embodiment of the invention, and specifically, details of step S202 of the flow shown in FIG. 10A.
Figure 10C:
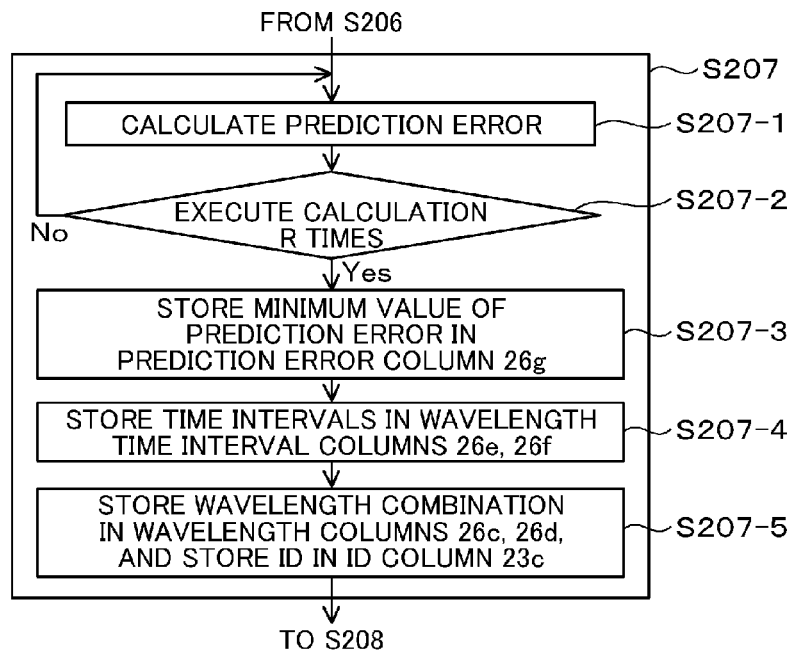
FIG. 10C is a flowchart representing the analyzing process flow performed by the arithmetic unit according to the present embodiment of the invention, and specifically, details of step S207 of the flow shown in FIG. 10B.

In this step specifically shown in FIG. 10B, the arithmetic unit 21 performs the process of calculating the first prediction error using the emission intensity in the first half of the time interval in the etching process (S202-1), and the process of calculating the second prediction error using the emission intensity in the second half of the time interval in the etching process (S202-2). The minimum value of the first and the second prediction error is stored in the corresponding line of the column 25*g* for prediction error (S202-3). Then the time interval that provides the minimum value is stored in the columns 25*e* for wavelength 1-time interval and 25*f* for wavelength 2-time interval (S202-4).

Figures 10D, 11:
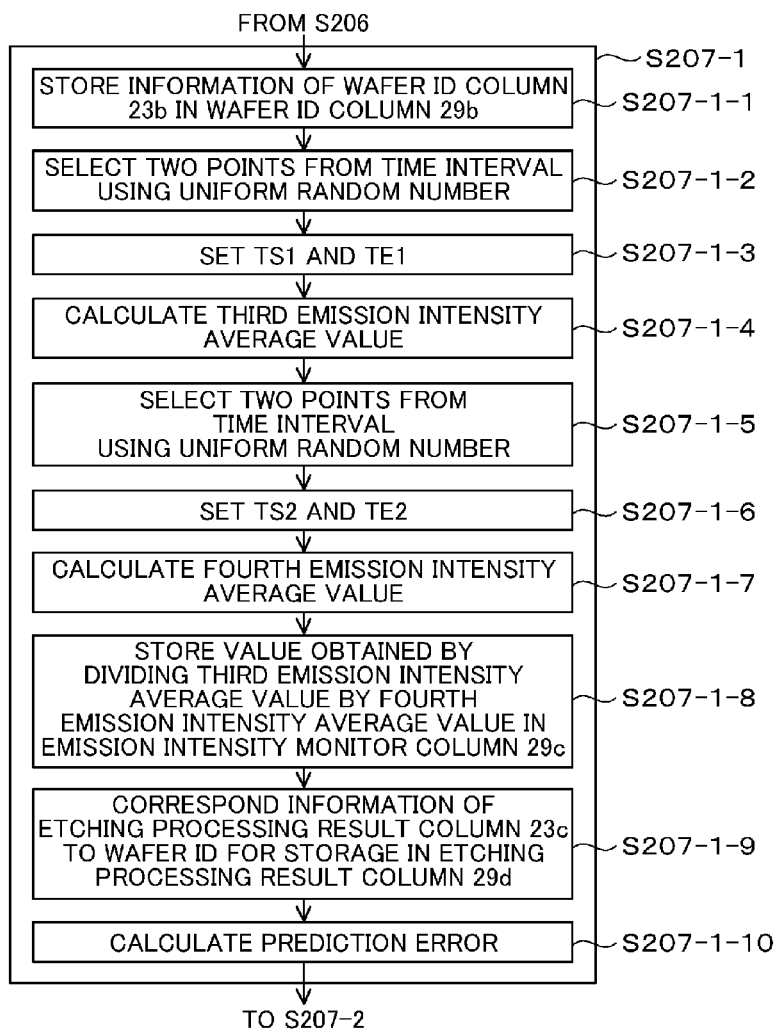
FIG. 10D is a flowchart representing the analyzing process flow executed by the arithmetic unit according to the present embodiment of the invention, and specifically, details of step S207-1 of the flow shown in FIG. 10C.
FIG. 11 is a table of data representing emission intensity monitor values used for calculating a prediction error according to an embodiment of the invention.

The process of calculating the first prediction error in S202-1 generates an emission intensity monitor value data table 29*a* shown in FIG. 11 using the emission intensity value in the first half of the time interval in the etching process.

The column 29*b* for wafer ID of the emission intensity monitor value data table 29*a* stores the information that indicates the wafer with acquired data, for example, the information stored in the column 23*b* for wafer ID of the etching processing result table 23*a* shown in FIG. 5.

The column 29*c* for emission intensity monitor value stores the emission intensity monitor value obtained by dividing the first emission intensity average value by the second emission intensity average value (S202-5) as shown below.

The first emission intensity average value is derived from values stored in the column 24*e* for emission intensity of the OES data table 24*a* shown in FIG. 6 at the row specified by the wavelength stored in the corresponding line of the column 25*c* for wavelength 1 of the initial search result data table 25*a* shown in FIG. 7 in the time lines from start to the intermediate stage of the etching process. The time lines from start to the intermediate stage of the etching process correspond to those from 1 to 50 as shown in FIG. 6, for example.

The second emission intensity average value is derived from values stored in the column 24*e* for emission intensity of the OES data table 24*a* shown in FIG. 6 at the row specified by the wavelength stored in the corresponding line of the column 25*d* for wavelength 2 of the initial search result data table 25*a* shown in FIG. 7 in the time lines from start to the end of the etching process. The time lines from start to the end of the etching process correspond to those from 1 to 100 as shown in FIG. 6, for example.

The column 29*d* for etching processing result of the emission intensity monitor value data table 29*a* shown in FIG. 11 stores the value stored in the column 23*c* for etching process result of the etching processing result data table 23*a* shown in FIG. 5 so as to be corresponded to the wafer ID (S202-6).

In the aforementioned step S202-1, the arithmetic unit 21 calculates the prediction error (e) upon prediction of the etching processing result with the emission intensity monitor value through the following formulae (1) to (5). The obtained prediction error (e) becomes the first prediction error.

$$X_{11} = \sum x_i^2 - \frac{\left(\sum x_i\right)^2}{n} \qquad \text{[Formula 1]}$$

$$X_{12} = \sum y_i^2 - \frac{(\sum y_i)^2}{n} \quad \text{[Formula 2]}$$

$$X_{13} = \sum x_i y_i - \frac{(\sum x_i)(\sum y_i)}{n} \quad \text{[Formula 3]}$$

$$a = \frac{X_{13}}{X_{11}} \quad \text{[Formula 4]}$$

$$e = \frac{(X_{12} - a\, X_{13})}{n} \quad \text{[Formula 5]}$$

In the above formulae, the code $x_i$ denotes the value stored at the ith row of the column 29c for emission intensity monitor value of the emission intensity monitor value data table 29a shown in FIG. 11, and the code $y_i$ denotes the value stored at the ith row of the column 29d for etching processing result. The code n denotes the number of rows of the emission intensity monitor value data table 29a, and the code E denotes the sum of all the rows of the emission intensity monitor value data table 29a.

The calculated value will be described referring to FIGS. 13A and 13B. A graph A200 shown in FIG. 13A and a graph B200 shown in FIG. 13B are scatter charts showing values stored in the column 29c for emission intensity monitor value and the column 29d for etching processing result.

Figure 13A:
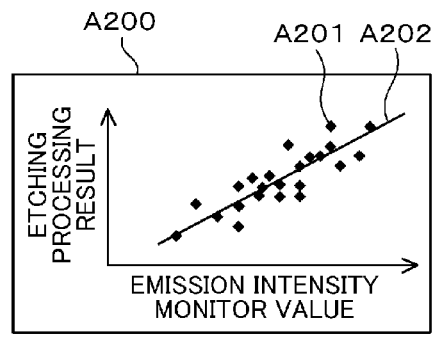
FIG. 13A is a scatter chart representing a relationship between the emission intensity monitor values and the etching processing results for explaining the process of calculating the prediction error according to an embodiment of the invention.
Figure 13B:
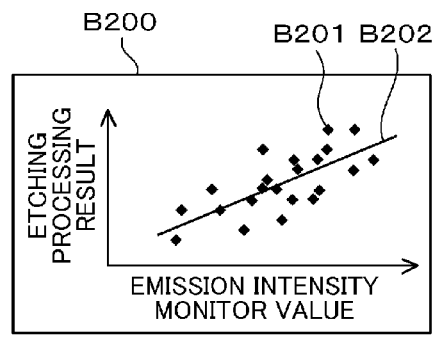
FIG. 13B is a scatter chart representing a relationship between the emission intensity monitor values and the etching processing results for explaining the process of calculating the prediction error according to an embodiment of the invention.

The points, for example, a point A201 of the graph A200 shown in FIG. 13A, and a point B201 of the graph B200 shown in FIG. 13B, represent values stored in the respective rows of the column 29c for emission intensity monitor value of the emission intensity monitor value data table 29a shown in FIG. 11. They are derived from plotting by taking the value stored in the column 29c for emission intensity monitor as the horizontal axis, and taking the value stored in the column 29d for etching processing result as the vertical axis.

A straight line A202 of the graph A200 shown in FIG. 13A and a straight line B202 of the graph B200 shown in FIG. 13B represent straight lines (recession lines) which minimize the average value of sum of squares of the distance from each point. The first prediction error (e) calculated through the formula 5 represents a square root of sum of squares of the distance between each point and the straight line.

FIGS. 13A and 13B are scatter charts for taking the emission intensity monitor values with respect to combinations of different values of wavelength and time interval. Accordingly, values of the etching processing results at the respective points are the same, but those of the emission intensity monitor are different.

Comparing the calculated prediction errors (e) between those shown in the graph A200 of FIG. 13A and the graph B200 of FIG. 13B, the prediction error (e) of the graph A200 of FIG. 13A becomes smaller. Referring to the graph A200 of FIG. 13A, the points distribute closer to the recession line comparing to the graph B200 of FIG. 13B, and it clearly shows that the emission intensity monitor values of FIG. 13A are more suitable for prediction of the etching processing result in the aforementioned step of calculating the etching processing result prediction value (S103). By selecting the wavelength and the time interval having smaller prediction error (e), it makes possible to set the wavelength and the time interval which are suitable for the process of calculating prediction values of the etching processing result.

The calculated prediction error (e) is stored in the corresponding line of the column 25g for prediction error of the initial search result data table 25a shown in FIG. 7 as the information for evaluating adequacy of the combination of wavelength and time interval in the subject line.

Any value other than the prediction error calculated herein may be used so long as such value represents dispersion of the prediction result upon prediction of the etching processing result using the emission intensity monitor value. For example, it is possible to use the correlation coefficient or square of correlation coefficient between the emission intensity monitor value and the etching processing result.

In the process step S202-2 of calculating the second prediction error, like the process step of calculating the first prediction error, the emission intensity value in the second half of time interval in the etching process is used to generate the emission intensity monitor value data table 29a shown in FIG. 11, and to calculate the prediction error (e) upon prediction of the etching processing result using the emission intensity monitor value 29c through the formulae 1 to 5. The resultant prediction error (e) becomes the second prediction error.

In calculation of the second prediction error, the column 29c for emission intensity monitor value stores the emission intensity monitor value obtained by dividing the first emission intensity average value by the second emission intensity average value as described below.

The first emission intensity average value is derived from values stored at the row specified by the wavelength stored in the corresponding line of the column 25c for wavelength 1 of the initial search result data table 25a shown in FIG. 7 in the time line from the intermediate stage to the end of the etching process in the column 24e for emission intensity of the OES data table 24a of FIG. 6. For example, the time line from the intermediate stage to the end of the etching process represents those from 51 to 100 in the column 24d for time shown in FIG. 6.

The second emission intensity average value is derived from values stored at the row specified by the wavelength stored in the corresponding line of the column 25d for wavelength 2 in the time line from start to the end of the etching process in the column 24e for emission intensity of the OES data table 24a of FIG. 6. For example, the time line from start to the end of the etching process represents those from 1 to 100 shown in FIG. 6.

In S202-3, the arithmetic unit 21 compares the first prediction error calculated in S202-1 with the second prediction error calculated in S202-2, and stores the minimum value in the corresponding line of the column 25g for prediction error shown in FIG. 7.

In S202-4, if the first prediction error is minimum, the arithmetic unit stores the information indicating the time interval from start to the intermediate stage of the etching process in the column 25e for wavelength 1-time interval shown in FIG. 7, and further stores the information indicating the time interval from start to the end of the etching process in the column 25f for wavelength 2-time interval.

If the second prediction error is minimum, the information indicating the time interval from the intermediate stage to the end of the etching process is stored in the column 25e for wavelength 1-time interval shown in FIG. 7, and the information indicating the time interval from start to the end of the etching process is stored in the column 25f for wavelength 2-time interval.

Since the element contained in plasma changes as the etching process proceeds, the plasma emission data will change depending on the first half and the second half of the etching process. By evaluating the prediction error in a classified manner into the first half and the second half of the time interval, it makes possible to specify the time interval suitable for prediction of the etching processing result.

In the above method, the time interval of the emission intensity of the wavelength of the divided part is separated into the first half and the second half. It is also possible to calculate the prediction error by separating the time interval into the first half and the second half with respect to the wavelength of the dividing part. The first half or the second half of the time interval may further be divided in detail to calculate the prediction error so as to use the resultant minimum value.

In S203, the arithmetic unit 21 calculates the standard deviation of time series change in the emission intensity for the respective combinations of wavelength stored in the lines of the initial search result data table 25a shown in FIG. 7, and the resultant value is stored in the column 25j for standard deviation of emission intensity. The arithmetic unit 21 sequentially executes the process from the upper line of the initial search result data table 25a. The line to be processed will be referred to as the subject line.

In the column 24e for emission intensity of the OES data table 24a in FIG. 6, the standard deviation of time series change in the emission intensity is calculated through the formula 6 with respect to data at the row specified by the wavelength stored in the subject line of the column 25c for wavelength 1 shown in FIG. 7.

$$sd = \left\{ \sum z_i^2 - \frac{\left(\sum z_i\right)^2}{m} \right\} / (m-1) \qquad \text{[Formula 6]}$$

Referring to the formula 6, the code $z_i$ denotes the value stored in the ith line among those data pieces at the row specified by the wavelength stored in the subject line in the column 25c for wavelength 1 shown in FIG. 7. The code m denotes the number of lines of the column 24e for emission intensity. The code E denotes the sum of data in all the lines of the column 24e for emission intensity. The sd value calculated through the formula 6 is one of values indicating the degree of time series change in the emission intensity.

Figure 14A:
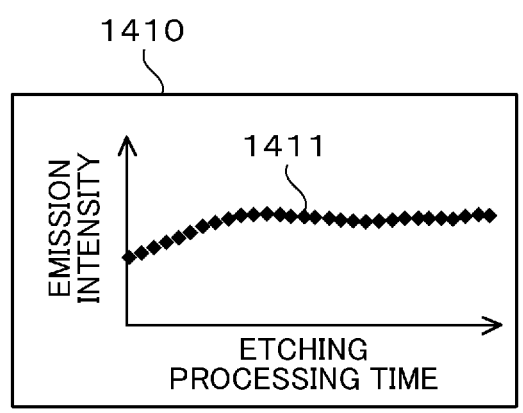
FIG. 14A is a scatter chart representing a relationship between the etching processing time and the emission intensity, indicating a time series change in the emission intensity according to an embodiment of the invention.
Figure 14B:
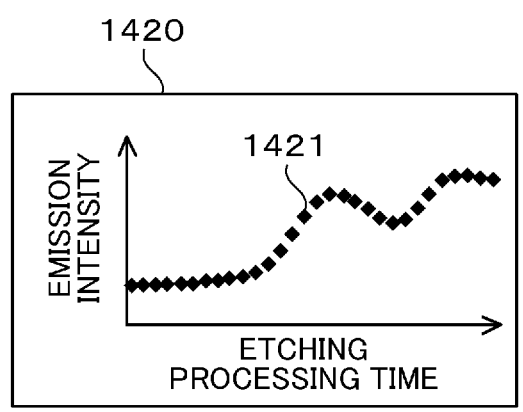
FIG. 14B is a scatter chart representing a relationship between the etching processing time and the emission intensity, indicating a time series change in the emission intensity according to an embodiment of the invention.

FIGS. 14A and 14B show the respective time series changes in the emission intensity for each wavelength. A graph 1410 of FIG. 14A has small time series change in emission intensity 1411, and a small sd value. The wavelength of this type has small change in the average value of the emission intensity even if the time interval is changed. Accordingly, changing the time interval is not likely to improve the prediction error.

Meanwhile, a graph 1420 of FIG. 14B has large time series change in emission intensity 1421 as well as a large sd value. The wavelength of this type has the average value of emission intensity which largely varies with change in the time interval. Accordingly, changing the time interval is likely to improve the prediction error. In the process of specifying the wavelength combination in S204, the wavelength combination is specified in consideration of the sd value.

The step S203 calculates the sd value with respect to the wavelength stored in the column 25c for wavelength 1 shown in FIG. 7. It is also possible to calculate the sd value with respect to the wavelength stored in the column 25d for wavelength 2. It is further possible to obtain the sum or a weighted average of the sd value calculated with respect to the wavelength stored in the column 25c for wavelength 1 and the sd value calculated with respect to the wavelength stored in the column 25d for wavelength 2 so as to be stored in the column 25j for standard deviation of emission intensity.

In S204, the arithmetic unit 21 determines the specified wavelength combination for continuous search in the time interval using the value stored in the column 25g for prediction error and the value stored in the column 25j for standard deviation of emission intensity.

The arithmetic unit 21 ranks the prediction error sequentially from the smaller value in the line through calculation using the prediction error value stored in the column 25g for prediction error shown in FIG. 7, and stores the rank in the respective lines of the column 25h for prediction error rank.

The arithmetic unit 21 ranks the prediction error sequentially from the smaller value in the line through calculation with respect to the line in which the value stored in the column 25j for standard deviation of emission intensity is smaller than the predetermined threshold value 1 (for example, 100), and stores the rank in the respective lines of the column 25k for prediction error rank 1. Likewise, the arithmetic unit 21 ranks in the prediction error sequentially from the smaller value in the line through calculation with respect to the line in which the value stored in the column 25j for standard deviation of emission intensity is equal to or larger than the threshold value 1, and stores the rank in the respective lines of the column 25l for prediction error rank 2.

The arithmetic unit 21 stores the code ◯ in the column 25i for continuous search so that the search is continuously performed in the time interval with respect to the line having the rank stored in the column 25h for prediction error rank, the column 25k for prediction error rank 1, or the column 25l for prediction error rank 2 equal to or smaller than a predetermined threshold value 2 (for example, 10). The code – is stored in the column 25i for continuous search with respect to any other line.

The aforementioned process allows restriction of the wavelength combination for search in the time interval so as to reduce the search time.

In S205, the arithmetic unit 21 presents the information stored in the initial search result data table 25a to the operator so as to confirm whether or not the continuous search is required.

Figure 15:
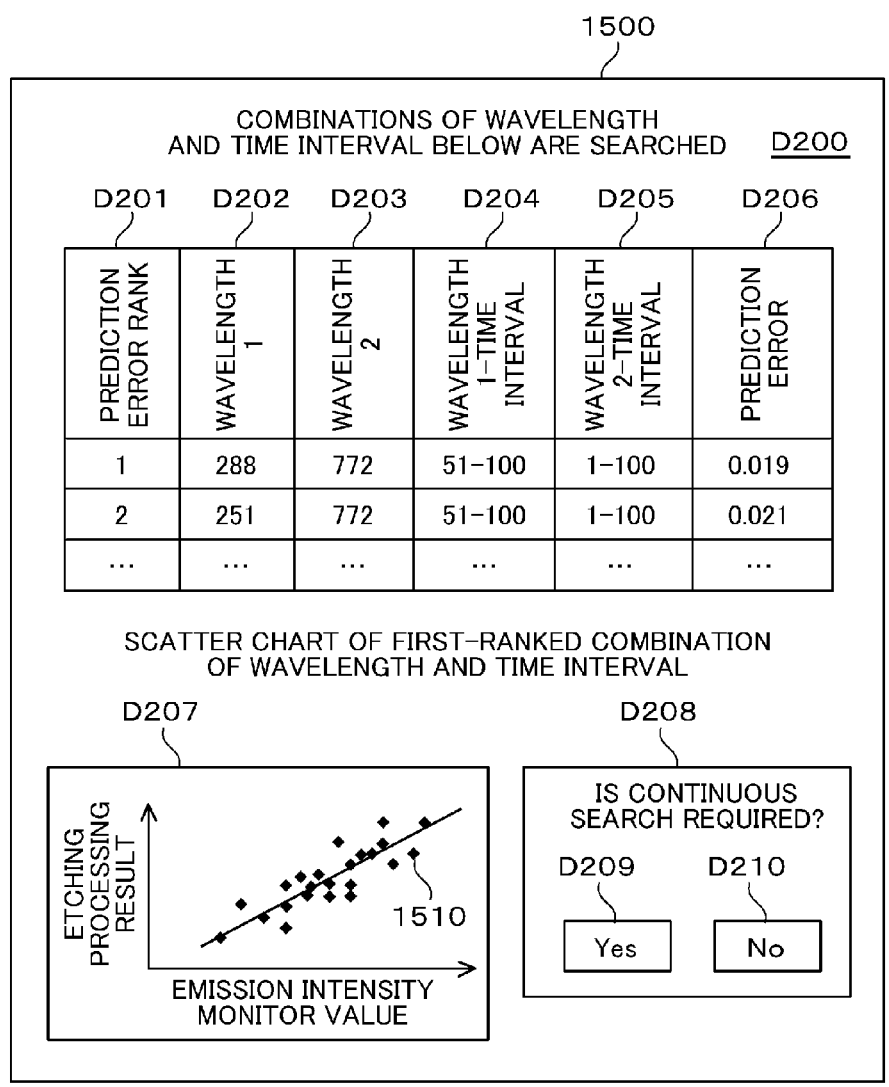
FIG. 15 is a front view of the screen displaying the initial search result according to an embodiment of the invention.

FIG. 15 shows an example of a screen of the output displayed by the arithmetic unit 21 for the operator. An output screen 1500 shown in FIG. 15 displays a list D200 of combinations of wavelength and time interval, a scatter chart display section D207, and a continuous search instruction section D208.

The list D200 of combinations of wavelength and time interval includes columns D201 for prediction error rank, D202 for wavelength 1, D203 for wavelength 2, D204 for wavelength 1-time interval, D205 for wavelength 2-time interval, and D206 for prediction error. Information data pieces respectively stored in the columns 25h for prediction error rank, 25c for wavelength 1, 25d for wavelength 2, 25e for wavelength 1-time interval, 25f for wavelength 2-time interval, and 25g for prediction error of the initial search result data table 25a shown in FIG. 7 are displayed from the first ranked line stored in the column 25h for prediction error rank in descending order.

The scatter chart display section D207 displays a scatter chart 1510 showing the emission intensity monitor values and the etching processing results which are derived from calculating the emission intensity monitor values with respect to combination of wavelength and time interval with first ranked prediction error.

The continuous search instruction section D208 displays the information for confirming the operator whether or not the continuous search is required. Pressing a button D209 or D210 allows the arithmetic unit 21 to advance the process to the next process step S206.

In S206, in response to pressing the button D209, that is, Yes in the continuous search instruction section D208 by the operator, the process proceeds to the next step S207. Meanwhile, in response to pressing the button S210, that is, No, the first ranked data shown in FIG. 15 is stored in the control condition data storage unit 28 to end the analyzing process.

In S207, the arithmetic unit 21 evaluates the prediction error in the time interval divided in more detail than the case in step S202 with respect to the wavelength combination that the code ○ indicating the continuous search is stored in the column 25i for continuous search of the initial search result data table 25a shown in FIG. 7. The line to be processed will be referred to as the subject line. The detailed process flow in this step will be described referring to FIG. 10C.

In this step, the process of calculating the prediction error with the emission intensity in the time interval which has been set using the random number (S207-1) is executed R times as the predetermined number of times (for example, 1000 times) (S207-2), the minimum value of the calculated prediction error values is stored in the subject line of the column 26g for prediction error of the random number search result data table 26a shown in FIG. 8 (S207-3), and the time interval for providing the minimum value is stored in the columns 26e for wavelength 1-time interval and 26f for wavelength 2-time interval (S207-4). The combination of the wavelength for search and its ID are stored in the columns 26b for ID, 26c for wavelength 1, and 26d for wavelength 2 (S207-5).

The arithmetic unit 21 repeats the process of calculating the prediction error (S207-1) R times to obtain R prediction errors in the different time intervals. The detailed procedure in the process of calculating the prediction error (S207-1) will be described referring to FIG. 10D. In the process of calculating the prediction error (S207-1), the emission intensity monitor value data table 29a shown in FIG. 11 is generated like the process in S202 to calculate the prediction error value through the formulae 1 to 5.

The column 29b for wafer ID of the emission intensity monitor value data table 29a shown in FIG. 11 stores the information indicating the wafer with acquired data, for example, the information stored in the column 23b for wafer ID of the etching processing result table 23a shown in FIG. 5.

The arithmetic unit 21 selects two points using the uniform random number from those in the time interval (in the example shown in FIG. 6, from 1 to 100) in the column 24d for time, which are stored in the OES data table 24a shown in FIG. 6 (S207-1-2). The small value and the large value of those of the selected time are set to TS1 and TE1, respectively (S207-1-3). The arithmetic unit 21 calculates the third emission intensity average value of those stored at the row specified by the wavelength stored in the corresponding line of the column 25c for wavelength 1 shown in FIG. 7 in the time line from TS1 to TE1 of the column 24e for emission intensity of the OES data table 24a of FIG. 6 (S207-1-4).

The arithmetic unit 21 selects two points using the uniform random number of time stored in the OES data table 24a (S207-1-5). The small value and the large value among the selected time values are set to TS2 and TE2, respectively (S207-1-6). The arithmetic unit 21 calculates the fourth emission intensity average value of those stored at the row specified by the wavelength stored in the corresponding line of the column 25d for wavelength 2 shown in FIG. 7 in the time line from TS2 to TE2 of the column 24c for emission intensity of the OES data table 24a of FIG. 6 (S207-1-7).

The column 29c for emission intensity monitor value shown in FIG. 11 stores the value obtained by dividing the third emission intensity average value by the fourth emission intensity average value (S207-1-8) as described below.

The column 29d for etching processing result of the emission intensity monitor value data table 29a stores the value stored in the column 23c for etching processing result of the etching processing result table 23a shown in FIG. 5 so as to be corresponded to the wafer ID (S207-1-9).

The arithmetic unit 21 calculates the prediction error (e) for prediction of the etching processing result using the emission intensity monitor value through the aforementioned formulae 1 to 5 (S207-1-10). The calculated prediction error (e) becomes the one to be obtained in S207.

The arithmetic unit 21 stores the minimum value of prediction errors calculated R times in the subject line of the column 26g for prediction error of the random number search result data table 26a shown in FIG. 8 in S207-3, and stores the time interval providing the minimum value in the columns 26e for wavelength 1-time interval and 26f for wavelength 2-time interval in S207-4. The wavelength combination determined to be searched in S207-5 and the corresponding ID are stored in the columns 26b for ID, 26c for wavelength 26c, and 26d for wavelength 2, respectively.

In S208, the arithmetic unit 21 calculates the rank of the prediction error values from the line of smaller value so as to be stored in the respective lines of the column 26h for prediction error rank using the prediction error value stored in the column 26g for prediction error of the random search result data table 26a shown in FIG. 8 The arithmetic unit 21 specifies the line with the lowest rank stored in the column 26h for prediction error rank, stores the code ○ in the column 26i for continuous search so that the search in the time interval is continued in the subject line, and further stores the code – with respect to any other line in the column 26i for continuous search. In this example, only one line is specified. However, it is possible to specify a plurality of lines in the order of smaller prediction error with the code ○ for continuous search.

The aforementioned process makes it possible to restrict the wavelength combination for search in the time interval, thus reducing the search time.

In S209, the arithmetic unit 21 specifies the line that stores the code ○ indicating the continuous search in the column 26i for continuous search of the random number search result data table 26a shown in FIG. 8, reads the information stored in the subject line of the columns 26b for ID, 26c for wavelength 1 and 26d for wavelength 2, and stores the read information in the columns 27b for ID, 27c for wavelength 1, and 27d for wavelength 2 of the final search result data table 27a shown in FIG. 9.

The arithmetic unit 21 further calculates the emission intensity monitor value with respect to combination of all the possible time intervals with the wavelength stored in the columns 27c for wavelength 1 and 27d for wavelength 2, and calculates the prediction error (e) with respect to the emission intensity monitor values through the formulae 1 to 5. Among the calculated values of prediction error (e), the minimum value is stored in the column 27g for prediction error of the final search result data table 27a, and the time interval providing the minimum value is stored in the columns 27e for wavelength 1-time interval and 27f for wavelength 2-time interval.

If the code ◯ indicating the continuous search is stored in a plurality of lines of the column 26i for continuous search, the prediction error (e) is calculated with respect to the combinations of all possible time intervals with the wavelength values in the respective lines. Among combinations of the respective wavelength values and time intervals, the combination of wavelength and time interval, which exhibits the minimum prediction error, and the corresponding ID are stored in the final search result data table 27a.

Figure 16:
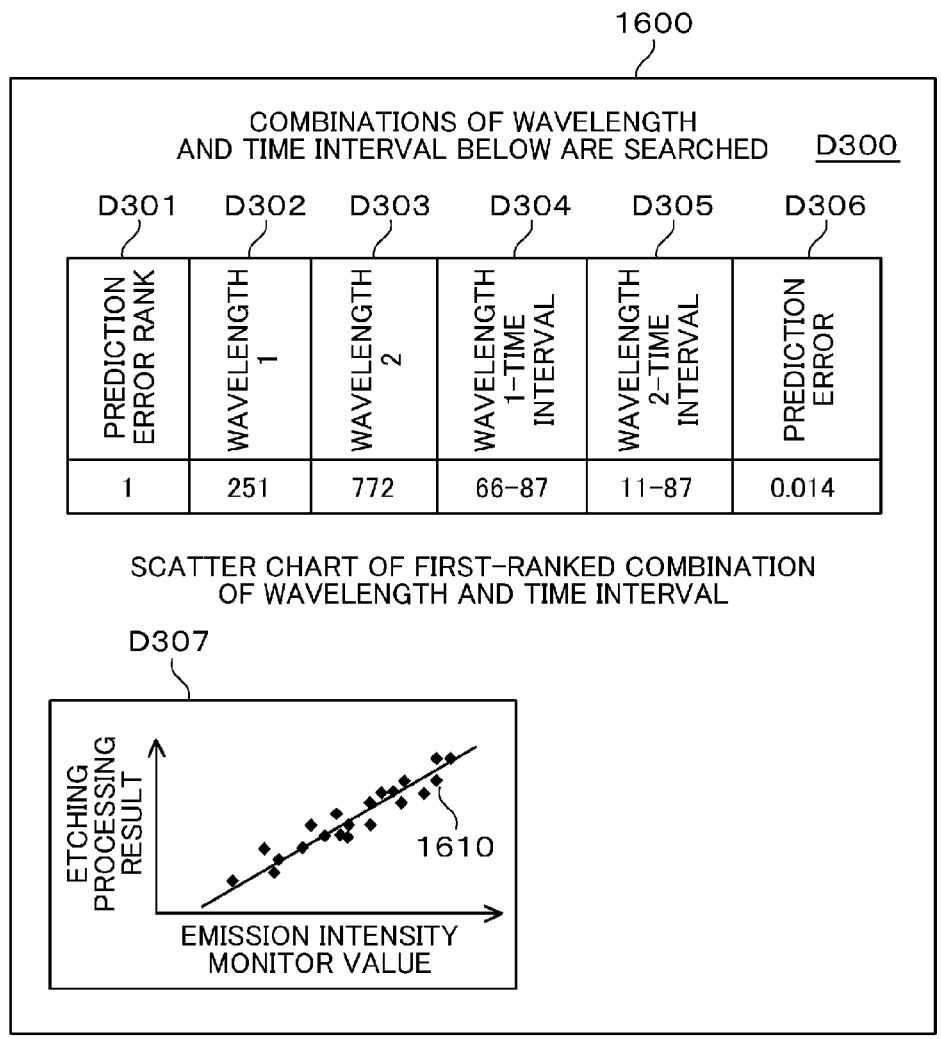
FIG. 16 is a front view of the screen displaying the final search result according to an embodiment of the invention.

In S210, the arithmetic unit 21 outputs the values stored in the final search result data table 27a shown in FIG. 9 and data relevant to the scatter chart on the screen as the final search results to end the process. FIG. 16 shows an example of the output screen presented by the arithmetic unit 21 to the operator.

The output screen shown in FIG. 16 displays a table D300 of combination of wavelength and time interval, which exhibits the first ranked prediction error, and a scatter chart display section D307.

A column D301 for prediction error rank of the table D300 of wavelength and time interval which exhibits the first ranked prediction error stores the number 1 indicating that the value with the minimum prediction error among those of the searched wavelength and time interval. The columns D302 for wavelength 1, D303 for wavelength 2, D304 for wavelength 1-time interval, D305 for wavelength 2-time interval, and D306 for prediction error are displayed so as to display information stored in the columns 27c for wavelength 1, 27d for wavelength 2, 27e for wavelength 1-time interval, 27f for wavelength 2-time interval, and 27g for prediction error.

The scatter chart display section D307 displays the scatter chart 1610 of the emission intensity monitor values and the etching processing result upon calculation of the emission intensity monitor value with respect to the combination of wavelength and time interval, which exhibits the first ranked prediction error.

The operator is allowed to identify the combination of wavelength and time interval which exhibits small prediction error of the etching processing result by confirming the output screen shown in FIG. 16.

The content displayed on the output screen which has been stored in the final search result data table 27a shown in FIG. 16 is stored in the control condition data storage region 28 of the storage unit 22 shown in FIG. 1.

In mass production, the data stored in the control condition data storage region 28 is used to control the plasma processing unit 11 with the control unit 13 for sequentially etching the wafer 114.

As described above, use of the analyzing method performed by the etching apparatus 1 (analyzing section 20) according to the present embodiment makes it possible to easily identify the combination of wavelength and time interval which exhibits the small prediction error of the etching processing result, from a plurality of combinations of wavelength and time interval.

The embodiment allows adequate determination of a plurality of conditions of measurement wavelength and measurement time as the plasma emission monitor condition. This makes it possible to execute the etching process highly accurately by maintaining the suitable flow rate of the etching processing gas.

The embodiment allows adequate determination of a plurality of conditions of measurement wavelength and measurement time as the plasma emission monitor condition. This makes it possible to provide the prediction value of the etching processing result with high accuracy while reducing the error compared with the related art.

As a result, it is possible to calculate the difference between the target value and the prediction value of the etching processing result with higher accuracy. The etching process is executed while accurately controlling the adjustment value of the etching processing condition, for example, the flow rate of the etching gas (gas flow rate) supplied from the gas supplier 117 so as to ensure formation of the fine shape pattern in the stable state.

The present invention has been described based on the present embodiment in detail. However, it is to be understood that the invention is not limited to the present embodiment as described above, and may be variously modified so long as it does not deviate from the scope of the invention.

The invention may be embodied in other specific forms without departing from the spirit or essential characteristics thereof. The present embodiment is therefore to be considered in all respects as illustrative and not restrictive, the scope of the invention being indicated by the appended claims, rather than by the foregoing description, and all changes which come within the meaning and range of equivalency of the claims are therefore intended to be embraced therein.

What is claimed is:

1. An etching apparatus comprising:
a processing chamber;
a plasma generating unit for generating plasma by introducing etching gas into the processing chamber exhausted in vacuum, in which a specimen is disposed;
a plasma emission monitor unit for monitoring emission of the plasma generated by the plasma generating unit;
an arithmetic unit for generating data concerning a condition of controlling the plasma generating unit;
a storage unit for storing the data concerning a condition of controlling the plasma generating unit, which has been generated by the arithmetic unit; and
a control unit for controlling the plasma generating unit based on a state of the plasma emission monitored by the plasma emission monitor unit and the control data stored in the storage unit,
wherein the arithmetic unit generates a wavelength combination from wavelength band of the plasma emission to be generated upon etching of the specimen as a condition for etching the specimen by the plasma generating unit, sets a time interval for calculating an average value of emission intensity in a time period for etching the specimen with respect to the generated wavelength combination, calculates a prediction error for prediction of the etching processing result using the average value of the emission intensity in the time interval with respect to each of the generated wavelength combinations, specifies a combination of wavelength and time interval, which exhibits a minimum value of the calculated prediction error, and generates a condition for etching the specimen using a prediction value of the etching processing result with respect to the combination of wavelength and time interval, which exhibits the minimum value of the specified prediction error.

2. The etching apparatus according to claim 1, wherein the arithmetic: unit specifies the wavelength combination from the calculated prediction error, calculates a second prediction error by searching the time interval with respect to the specified wavelength combination, and selects the combination of wavelength and time interval, which exhibits a minimum value of the second prediction error, as the wavelength and the time interval used for predicting the etching processing result.

3. The etching apparatus according to claim 1, further comprising an output section which outputs information concerning the combination of wavelength and time interval, which exhibits the minimum value of the prediction error selected, as the wavelength and the time interval for predicting the etching processing result by the arithmetic unit together with information of the prediction error.

* * * * *